(12) United States Patent
Lee et al.

(10) Patent No.: US 7,848,150 B2
(45) Date of Patent: Dec. 7, 2010

(54) FLASH MEMORY DEVICE AND METHOD OF OPERATING THE SAME

(75) Inventors: Keun Woo Lee, Yongin-si (KR); Ki Seog Kim, Seoul (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 306 days.

(21) Appl. No.: 12/055,641

(22) Filed: Mar. 26, 2008

(65) Prior Publication Data

US 2009/0067257 A1    Mar. 12, 2009

(30) Foreign Application Priority Data

Sep. 10, 2007    (KR) .................. 10-2007-0091518

(51) Int. Cl.
*G11C 11/34* (2006.01)
*G11C 16/06* (2006.01)

(52) U.S. Cl. .............................. 365/185.22; 365/185.17

(58) Field of Classification Search ............ 365/185.22, 365/185.17, 185.19, 185.33
See application file for complete search history.

(56) References Cited

U.S. PATENT DOCUMENTS

2007/0291536 A1* 12/2007 Kang .................. 365/185.2

FOREIGN PATENT DOCUMENTS

KR    100719381    5/2007
KR    100733952    6/2007

OTHER PUBLICATIONS

Notice of Allowance for Korean Application No. 10-2007-0091518.

* cited by examiner

*Primary Examiner*—Anh Phung
(74) *Attorney, Agent, or Firm*—Lowe Hauptman Ham & Berner LLP (57) ABSTRACT

A flash memory device and a method of operating the same is disclosed, in which the conditions of voltage (or current) applied during the reading operation are differently adjusted according to an accumulated number of times of a programming operation, an erasing operation or a reading operation (an accumulated number of operation cycle). Even if a level of the threshold voltage is changed to a level which differs from that of the target voltage by an increase of the accumulated number of operation cycle regardless of the programming operation (or the erasing operation) being normally performed, the reliability of the reading operation can be enhanced to prevent a malfunction of the memory cell from being generated.

24 Claims, 4 Drawing Sheets

FLASH MEMORY DEVICE AND METHOD OF OPERATING THE SAME

CROSS-REFERENCE TO RELATED APPLICATIONS

The present application claims priority to Korean Patent Application No. 10-2007-91518, filed on Sep. 10, 2007, which is incorporated herein by reference in its entirety.

BACKGROUND OF THE INVENTION

The present invention relates to a flash memory device and a method of operating the same, more particularly, to a flash memory device and a method of operating the same being capable of compensating operating characteristics which change as the number of the operation increases.

As one kind of the memory devices, a non-volatile memory device has a characteristic that data stored in the memory cells are not erased even if a power supply is turned off. A flash memory device is a typical non-volatile memory device. The flash memory device may be classified into a NOR flash memory device and a NAND flash memory device based on a structure of a memory cell array. A gate of the flash memory cell has a structure comprising a tunnel insulating layer, a floating gate, a dielectric layer and a control gate.

In such a flash memory device (in particular, the NAND flash memory device), a programming operation and an erasing operation are performed through an F-N (Fowler-Nordheim) tunneling phenomenon. Electrons are accumulated on the floating gate by the programming operation, and the electrons accumulated on the floating gate are discharged to a substrate by the erasing operation. And, when a reading operation is performed, a threshold voltage of the memory cell, which is changed according to the amount of electrons accumulated on the floating gate, is detected, and the data is read by a level of the detected threshold voltage.

As the number of operation cycle (i.e., the number of times the above operation is carried out) increases, the threshold voltage of the memory cell in the programming state (or the erasing state) changes.

Figure 1:
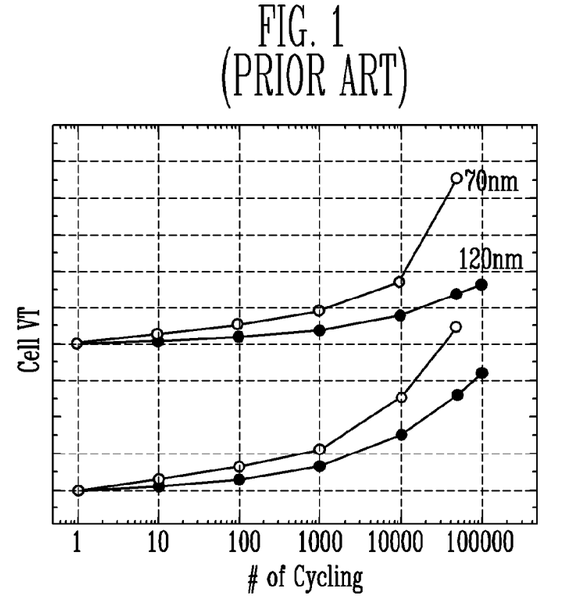
FIG. 1 is a characteristic graph showing a variation of threshold voltage according to the number of operation cycle of a flash memory device.

FIG. 1 is a characteristic graph showing a variation of threshold voltage according to the number of operation cycle of a flash memory device.

Referring to FIG. 1, as the number of operation cycle increases, the threshold voltage of the memory cell gradually increases even if the programming operation is performed under the same condition. The threshold voltage can also be increased at the time of performing the erasing operation. As the number of operation cycle increases, the electrons are trapped in the tunnel insulating layer, which can influence the programming operation.

If the threshold voltage is changed under the same conditions of the programming operation, the data stored in the memory cell is not read normally when the reading operation is performed, causing a malfunction of the memory cell.

SUMMARY OF THE INVENTION

In the flash memory device and the method of operating the same disclosed in the present invention, the conditions of the voltage (or the current) applied during the reading operation are differently adjusted according to an accumulated number of times of a programming operation, an erasing operation or a reading operation (the accumulated number of operation cycle), and so even if a level of the threshold voltage is changed to a level which differs from that of the target voltage by an increase of the accumulated number of operation cycle regardless of the programming operation (or the erasing operation) being normally performed, the reliability of the reading operation can be enhanced to prevent a malfunction of the memory cell from being generated.

A flash memory device according to one embodiment of the present invention comprises a main cell array including strings, each string being connected to one of a plurality of first bit lines; a flag cell array including flag cells in which the number of times of erasing of the memory cell during an erasing operation performed in a ISPE manner is stored; page buffers, each of which being connected to the bit lines; an operating voltage generator for supplying voltages necessary for programming/erasing/reading operations to the main cell array and the flag cell array; and a bit line current control unit for controlling an amount of current flowing in the bit line so as to change a value of reference current used for sensing turn-on/turn-off states of the memory cell according to the number of times of erasing stored in the flag cell.

In the above flash memory device, the bit line current control unit controls an extent of turning on of a switching element connected between a sensing node in the page buffer and the bit line according to the number of times of erasing to adjust the amount of current flowing in the bit line.

The bit line current control unit controls an extent of turning on of the switching element to lower a value of the reference current as the number of times of erasing is increased.

A method of operating a flash memory device according to the first embodiment of the present invention comprises the steps of applying an erase voltage to a memory cell to perform an erasing operation of the memory cell; comparing a threshold voltage of the memory cell with a target voltage; increasing a level of the erase voltage to perform again the erasing operation of the memory cell block if the threshold voltage is higher than the target voltage; and storing the number of times of the erasing operation if the threshold voltage is smaller than the target voltage.

In the above method, the number of times of an erasing operation may be stored in the flag cell.

A method of operating a flash memory device according to the second embodiment of the present invention comprises the steps of performing an erasing operation of a memory cell block including a main cell array and a flag cell array; comparing a threshold voltage of the memory cell included in the main cell array with a target voltage; increasing a level of the erase voltage to perform again the erasing operation of the memory cell block if the threshold voltage is higher than the target voltage; and storing the number of times of the erasing operation if the threshold voltage is smaller than the target voltage.

In the above method, the number of times of an erasing operation may be stored in the flag cell included in the flag cell array.

The method of operating the flash memory device according to the second embodiment of the present invention further comprises the step of increasing the number of times of an erasing operation after performing the erasing operation.

A method of operating a flash memory device according to the third embodiment of the present invention comprises the steps of performing an erasing operation of a memory cell block in an ISPE (Increasement Step Pulse Erase) manner; storing the number of times of erasing of the memory cell block during the erasing operation; adjusting a level of voltage to be applied to a selected word line during a reading operation or a program-verifying operation, according to the number of times of erasing; and applying the adjusted voltage to the selected word line to perform the reading operation or the program-verifying operation.

In the above method, the voltage is adjusted proportional to the number of the times of erasing.

A method of operating a flash memory device according to the fourth embodiment of the present invention comprises the steps of performing an erasing operation of a memory cell block in an ISPE (Increasement Step Pulse Erase) manner; storing the number of times of erasing of the memory cell block during the erasing operation; setting a value of a reference current necessary for sensing a turning on/turning off of the memory cell during a reading operation or a program-verifying operation, according to the number of times of erasing; and applying the voltage to a word line of the memory cell and comparing the amount of current flowing in the memory cell and a value of the reference current to perform the reading operation or the program-verifying operation.

In the above method, the reference voltage is lowered as the number of the times of an erasing is increased. The reference current is set by adjusting an amount of current flowing in the bit line, and the amount of current flowing in the bit line is changed according to an extent of the turning-on of a switching element connected between a sensing node of a page buffer and the bit line.

The memory cell block comprises a main cell array and a flag cell array, and the number of times of erasing can be stored in the flag cell included in the flag cell array.

The method of operating a flash memory device according to the fourth embodiment of the present invention further comprises the step of increasing the number of times of erasing after performing the erasing operation.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. However, the embodiments of the present invention may be modified variously and a scope of the present invention should not be limited to the below embodiments. The description herein is provided for illustrating more completely to those skilled in the art.

Figure 2:
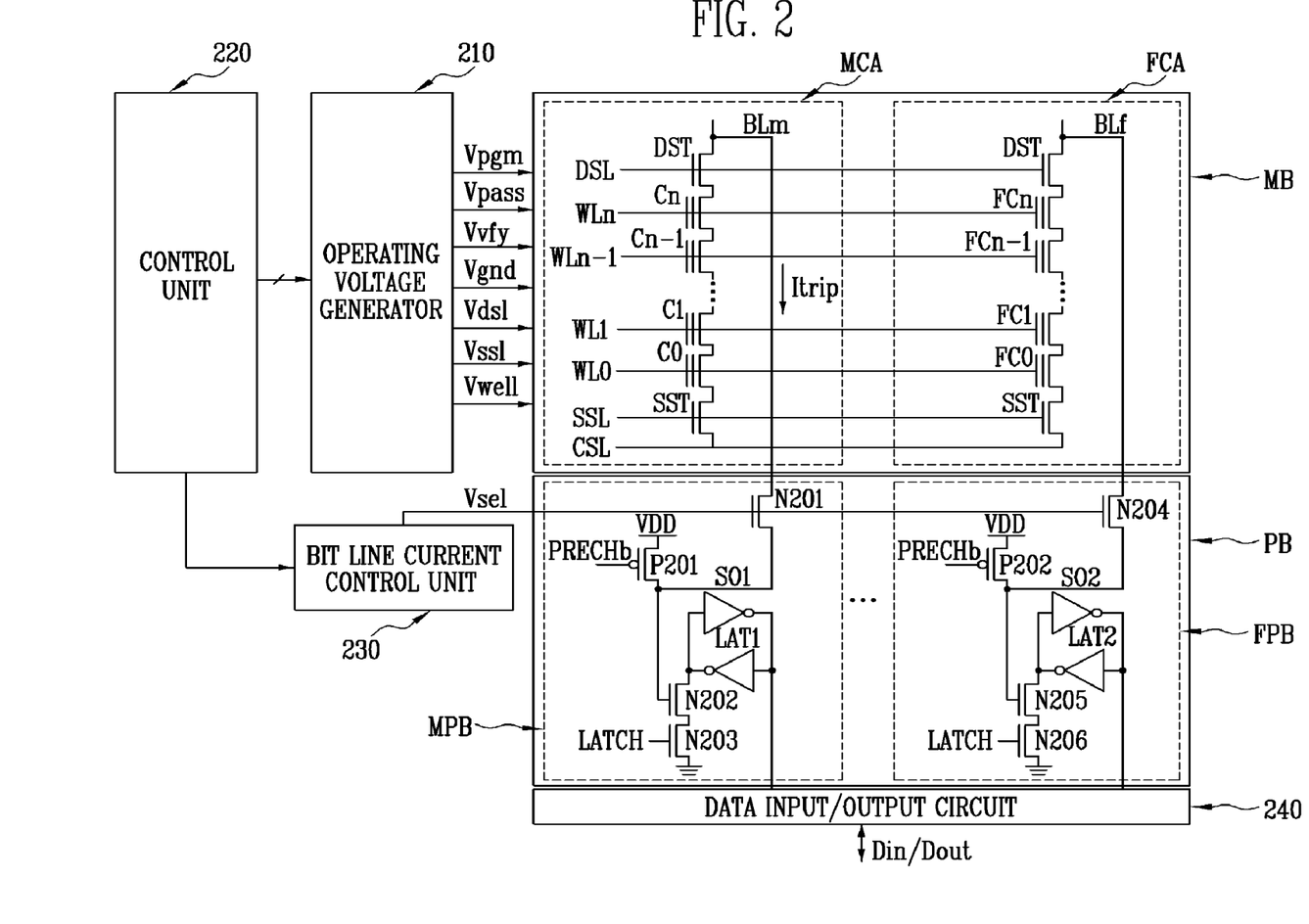
FIG. 2 is a circuit diagram for illustrating a flash memory device according to one embodiment of the present invention.

FIG. 2 is a circuit diagram for illustrating a flash memory device according to one embodiment of the present invention.

Referring to FIG. 2, a flash memory device according to one embodiment of the present invention comprises a memory cell array including a plurality of memory cell blocks MB (for convenience, only one cell block is shown in the drawing), a page buffer unit PB, an operating voltage generator 210, a control unit 220, a bit line current control unit 230 and a data input/output circuit 240.

The memory cell array includes a plurality of memory cell blocks MB. The memory cell block MB comprises a main cell array MCA and a flag cell array FCA. The entire structure of the main cell array MCA is the same as that of the flag cell array FCA except the number of strings (that is, the number of memory cells). To explain further concretely, the main cell array MCA comprises a plurality of strings. The string has a structure in which a drain select transistor DST, a plurality memory cells Co to Cn ("n" is an integer) and a source select transistor SST are connected to each other in series. A drain of the drain select transistor DST is connected to a bit line BLm and a source of the source select transistor SST is connected to a common source line CSL. Gates of the drain select transistors DST, each of which is included in each string, are connected to each other to serve as a drain select line DSL, gates of the source select transistors SST are connected to each other to serve as a source select line SSL, and gates of the memory cells are connected to each other to serve as word lines WL0 to WLn. In flag cell array FCA, the memory cells connected in series between the drain select transistor DST and the source select transistor SST serve as flag cells FC0 to FCn. The purpose of the flag cell will be described later.

The page buffer unit PB comprises a plurality of page buffers MPB and FPB. Here, the page buffer MPB is connected to the string included in the main cell array MCA through the bit line BLm, and the page buffer FPB is connected to the string included in the flag cell array FCA through the bit line BLf. Basically, the page buffer MPB comprises a first switching element N201 for connecting the bit line BLm and a sensing node SO1 in response to a bit line selection signal Vsel; a second switching element P201 for pre-charging the sensing node S01 in response to a pre-charge signal PRECHb; a third switching element N202 being operated according to an electric potential of the sensing node SO1; a latch LAT1 connected to one end of the third switching element N202; and a fourth switching element N203 connected to the other end of the third switching element N202 and being operated in response to a read control signal LATCH.

The above page buffer MPB is the minimal structural element required for operating as a general page buffer. The page buffer MPB may comprise at least two latches to increase an operation speed. A basic structure and operation of the general page buffer has been well known to those skilled in the art, and so the detail description thereon is omitted.

Output terminals of the latches LAT1 and LAT2 included in the page buffers MPB and FPB are connected to the data input/output circuit 240, and the data input/output circuit 240 outputs sequentially the data stored in the latches LAT1 and LAT2 or transmits the data, inputted from an exterior, to the latches LAT1 and LAT2.

The operating voltage generator 210 generates voltages required for operating the memory cell. To explain further concretely, the operating voltage generator 210 generates plural kinds of operating voltages (for example, Vpgm, Vpass, Vvfy, Vgnd, Vdsl, Vssl, Vwell) and transmits them to global word lines and global select lines. And, the operating voltage generator also provides the operating voltages to the selected memory cell MB in response to a block selection signal (not shown).

The control unit 220 controls the operating voltage generator 210 for making the operating voltage generator 210 output the voltages required for a programming operation, an erasing operation and a reading operation according to an operation mode of the memory cell. In addition, when an erasing operation of the memory cell is carried out in an increasement step pulse erase (ISPE) manner, the control unit 220 counts the number of times of applying an erase voltage Vwell to a well region on which the memory cell block MB is formed. That is, the control unit 220 counts the number of times of an erase performed in the erasing operation in the ISPE manner. To explain further concretely, in the erasing operation performed in the ISPE manner, the operating voltage generator 210 applies a positive voltage to the well to erase the memory cells of the selected memory cell blocks and then the control unit 220 verifies whether a threshold voltage of the memory cells is lowered to a target voltage or not. If the threshold voltage of the memory cells is not lowered to a target voltage, the operating voltage generator 210 applies positive voltage at a higher level to the well to erase again the memory cells and then detects a level of a threshold voltage of the memory cells. As described above, in the erasing operation performed in the ISPE manner, the positive voltage can be applied to the well in several times, and the control unit 220 counts the number of times the positive voltage is applied to the well (the number of times of erasing) during the erasing operation performed in the ISPE manner.

The number of times of erasing is stored in some flag cells in the flag cells FC0 to FCn of the memory cell blocks MB. An operation characteristic (particularly, a cycling characteristic) of the memory can be grasped according to the number of times erasing has been performed in the erasing operation using the ISPE manner, and a reading operation of the memory cell is changed according to the number of times the positive voltage has been applied, which is stored in the flag cell. That is, storing the number of times of erasing becomes one embodiment for grasping and storing a cycling characteristic of the memory cell. All the above operations are controlled by the control unit 220. The detail description thereof will be described later.

The bit line current control unit 230 is controlled by the control unit 220, and adjusts the reference current (Itrip1 or Itrip2 in FIG. 5) used for sensing a turn on/turn off state of the memory cell according to a cycling characteristic (i.e., the number of times of erasing) stored in the flag cell during a reading operation of the memory cell. To explain further concretely, the bit line current control unit 230 outputs the current control signal Vsel to the switching element N201 connected between the sensing node SO1 of the page buffer MPB and the bit line BLm according to a cycling characteristic, and an extent of the turning-on of the switching element N201 is adjusted in response to the current control signal Vsel so that the amount of current Itrip flowing in the bit line BLm is adjusted. According to adjustment of the amount of current Itrip flowing in the bit line BLm, a value of the reference current (Itrip1 or Itrip2 in FIG. 5) used for sensing the turn on/turn off state of the memory cell can be changed during the reading operation or the program verifying operation. To explain further concretely, if the amount of current Itrip flowing in the bit line is reduced, the value of the reference current can be lowered.

A method of operating the flash memory device having the above illustrated structure is described as follows.

Figure 3:
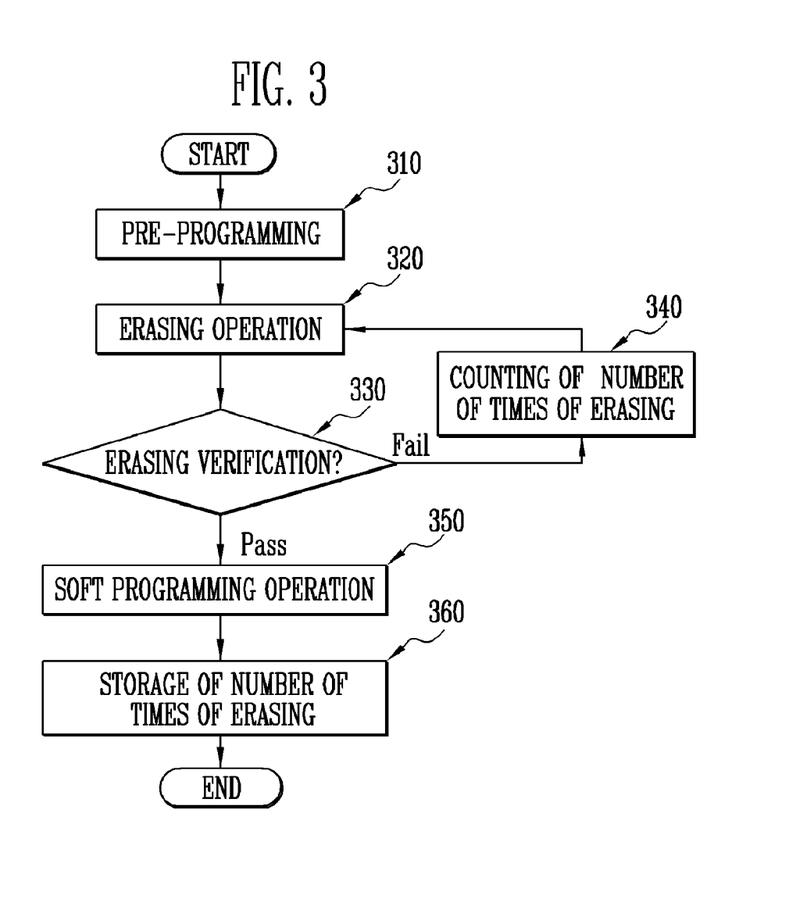
FIG. 3 and FIG. 4 are flow charts for illustrating a method of operating a flash memory device according to one embodiment of the present invention.
Figure 4:
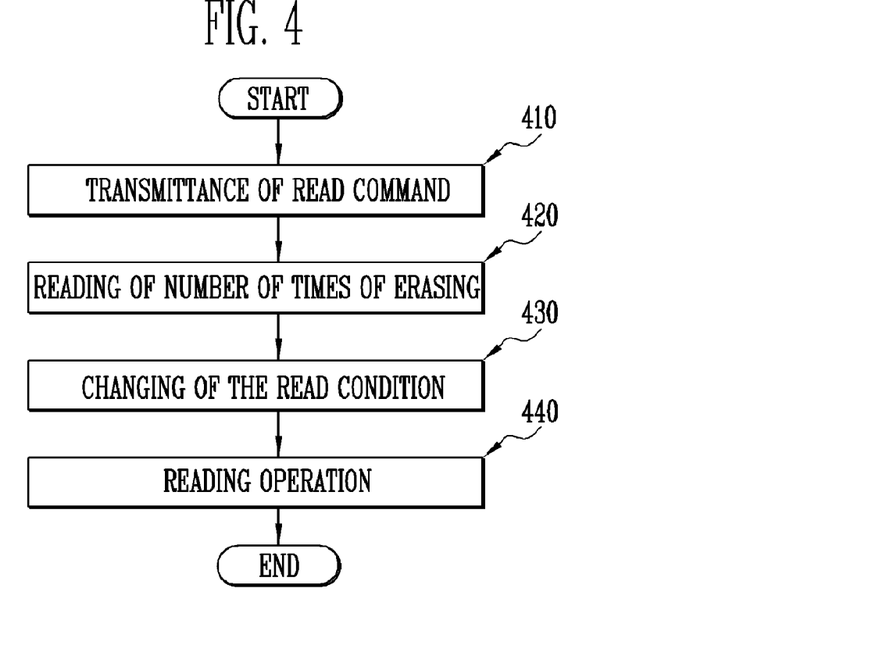

FIG. 3 and FIG. 4 are flow charts for illustrating a method of operating the flash memory device according to one embodiment of the present invention.

Referring to FIG. 2 and FIG. 3, the present invention grasps a cycling characteristic of the memory cell through an erasing operation performed in the ISPE manner and then stores the cycling characteristic. As the number of times erasing operation and reading operation are performed is accumulated, a threshold voltage characteristic of the memory cell changes as shown in FIG. 1. In the present invention, during the erasing operation performed in the ISPE manner, the number of times the memory cell is erased is counted (i.e., count the number of times the positive voltage is applied) for lowering a threshold voltage of the memory cell to a target voltage and the conditions of the voltage applied during the reading operation are adjusted according to the number of times of erasing. The above process is described in more detail below.

First, if an erase command signal is inputted, one of the pluralities of memory cell blocks is selected in response to an address signal, and an erasing operation for the selected memory cell block MB is performed in the ISPE manner. The memory cell block comprises the memory cells having a threshold voltage smaller than 0 (zero) volt and the memory cells having a threshold voltage higher than 0 (zero) volt. If there are memory cells having a threshold voltage which is already low among the memory cells having the threshold voltage smaller than 0 (zero) volt, the threshold voltage can be further lowered by performing an erasing operation. Accordingly, in order to raise a threshold voltage of the memory cells having a threshold voltage which is extremely smaller than 0 (zero) volt, a pre-programming operation may be performed (step 310). The pre-programming operation is performed identically to a conventional programming operation except that a program voltage with a level smaller than that of a program voltage applied in a conventional programming operation is applied to the word line.

Subsequently, the first erasing operation for the memory cells included in the selected memory cell block MB (step 320). At this time, an erase voltage Vwell of 15 volts is applied to a bulk (for example, P well) of the memory cell block MB. After the first erasing operation, an erasing verification is performed for detecting whether a threshold voltage of the memory cells is lowered to a target voltage or not (step 330). If the threshold voltage of the memory cells is lowered to the target voltage, the erasing operation in the ISPE manner is completed, and if not, the erase voltage Vwell is increased to perform again the erasing operation. The above process is described in more detail below.

If the threshold voltage of the memory cell is not lowered to the target voltage in the erasing verification process, the number of times of erasing is increased for counting the number of times erasing is performed (step 340). That is, the number of times of erasing is increased from "1", which is an initial value, to "2". In the erasing operation performed in the ISPE manner, the number of times of erasing can be stored in a temporary storage means (for example, a register) included in the control unit 220. Subsequently, the erasing voltage Vwell is increased. For example, the erasing voltage can be increased to 15 volts to 20 volts, and can be increased by 0.1 volt to 1.0 volt per one time. In a case where the erasing voltage is increased by 1.0 volt per one time, the erasing voltage is increased to 16 volts and the second erasing operation of the memory cell is then performed (step 320).

The above steps 320, 330 and 340 are halted if the threshold voltage of the memory cell is lowered to the target voltage. After the threshold voltage of the memory cell is lowered to the target voltage, the memory cell (the over-erased memory cell) having the threshold voltage excessively smaller than the target voltage can be existed since an erasing ratio is excessively high. To increase the threshold voltage of such over-erased memory cell to the target voltage or an approximate value of the target voltage, a soft programming operation is performed (step 350). Like the pre-programming operation, the soft programming operation can be performed as a conventional programming operation except for applying a programming voltage smaller than that applied in the conventional programming operation.

If the soft programming operation is completed, the erasing operation performed in the ISPE manner is completed.

After the erasing operation performed in the ISPE manner is completed, the number of times of erasing of the memory cell performed in the erasing operation in the ISPE manner is stored (step 360). The number of times of erasing of the memory cell is stored in some of the flag cells FC0 to FCn of the memory cell block MB.

As the number of operation cycle is increased, the electrons are trapped in a tunnel insulating layer of the memory cell, and influence the threshold voltage of the memory cell (see FIG. 1). For example, the more the number of operation cycle is increased, the higher the threshold voltage of the memory cell becomes, and so the erasing operation of the memory cell should be performed in the ISPE manner in several times to lower the threshold voltage of the memory cell. That is, the more the number of operation cycle is increased, the more the erasing operation of the memory cell should be performed in the ISPE manner. Accordingly, it is possible to grasp a threshold voltage characteristic of the memory cell changed according to the cumulative number of operation cycle by means of the number of times of erasing operation of the memory cell, which is performed in the ISPE manner.

Like this, in the present invention, a variation of the threshold voltage of the memory cell caused by increased number of operation cycle is judged by means of the number of times erasing operation of the memory cell is performed in the ISPE manner. In addition, the conditions used for sensing a level of the threshold voltage during a reading operation of the memory cell are adjusted by means of the stored number of times erasing operation is performed.

Referring to FIG. 2 and FIG. 4, if a read command signal is transmitted from an exterior (step 410), a reading operation is initiated for reading the data stored in the memory through the programming operation. First of all, the number of times of erasing operation stored in the flag cell of the flag cell array FAC is read (step 420). According to the number of times of erasing operation read from the flag cell, the control unit 220 modifies the read condition when the reading operation is performed. For example, the control unit 220 can control the operating voltage generator 210 so as to change a level of an operating voltage to be applied to the select lines SSL and DSL and the word lines WL0 to WLn of the main cell array MCA (the first method), or can control the bit line current control unit 230 for changing a level of the signal Vsel transmitted to the switching element N201 connected between the bit line BLm and the sensing node SO1 of the page buffer MPB to change a value of the reference current used for sensing turning on/turning off of the memory cell (the second method).

Figure 5:
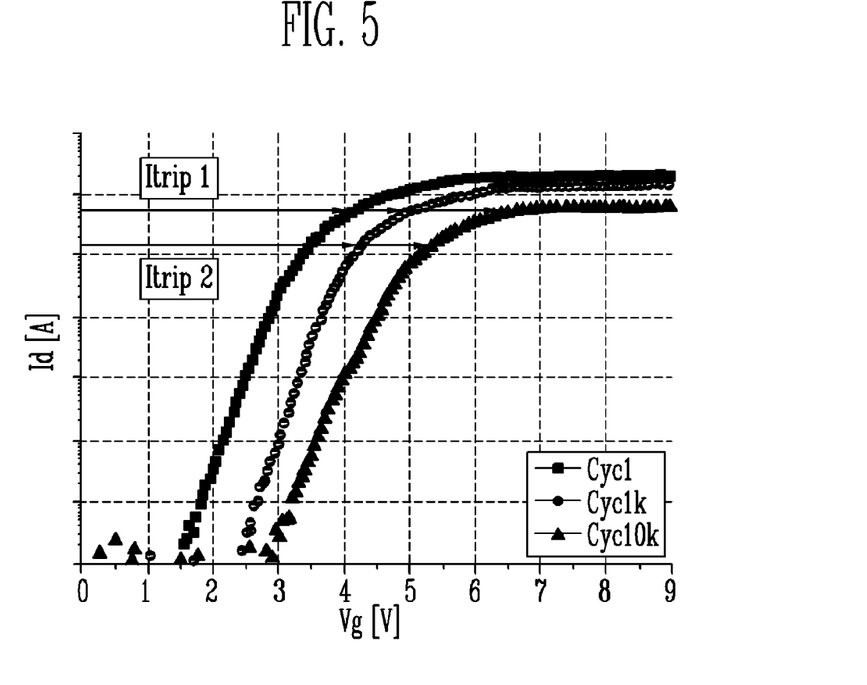
FIG. 5 is a graph for illustrating a read condition adjusted in a method of operating a flash memory device according to one embodiment of the present invention.

A method for adjusting the read conditions at the time of the reading operation will be described in more detail with reference to FIG. 5. FIG. 5 is a graph for illustrating the read condition adjusted in the method of operating the flash memory device according to one embodiment of the present invention.

Referring to FIG. 5, it can be seen that, according to increased number of operation cycle, as compared with the voltage Vg applied to the gate (i.e., the word line) of the memory cell, the amount of current Id flowed through the memory cell is reduced. The phenomenon means that the threshold voltage of the memory cell is increased.

On the assumption that the first current Itrip1 is the reference current by which the turning on/off status of the memory cell is decided, if the voltage Vg of 4 volts is applied to the gate at an early stage Cyc1, the first current Itrip 1 flows in the memory cell and the turning on/off status can be sensed through the first current. However, when the accumulated number of operation cycle is 1,000, if the voltage Vg of 4 volt is applied to the gate, the current smaller than the first current Itrip1 flows. In order to make the flowing current at the same level as the first current Itrip1, the voltage Vg applied to the gate should be approximately 5 volts. If the accumulated number of operation cycle is 10,000, the flowing current is much smaller than the first current Itrip1. In order to make the flowing current at the same level as the first current Itrip1, a still higher voltage Vg should be applied to the gate. If the voltage Vg applied to the gate is not adjusted, the reference current used for sensing a turn-on state and a turn-off state of the memory cell should be lowered from the first current Itrip1 to the second Itrip2.

Again, referring to FIG. 2 and FIG. 5, a level of the voltage to be applied to the gate (i.e., the word line) of the memory cell can be adjusted according to the number of operation cycle stored in the flag cell through the first method in the erasing operation performed in the ISPE manner. Here, the mentioned word line indicates the word line to which the cell to be read is connected. For example, the number of times of erasing stored in the flag cell is read prior to applying the voltages (in particular, the voltage applied to the word line) necessary for the reading operation. In addition, in a case where the number of times of erasing is "1", this may mean that the accumulated number of operation cycle corresponds to the initial value, and so the word line voltage is then set as 3 volts, and in case where the number of times of erasing is "2", this may mean that the accumulated number of operation cycle corresponds to the value corresponding to 1000, and so the word line voltage is then set as 4 volts. Also, in a case where the number of times of erasing is "3", this may mean that the accumulated number of operation cycle corresponds to 10000, and so the word line voltage can be then set as 5 volts. A relation between the number of times of erasing and the number of operation cycle and the word line voltage described above are exemplarily provided for illustrating the operation and can be changed.

When the reading operation is performed, if the word line voltage is changed according to the number of times of erasing in view of a change of the threshold voltage, it is possible to prevent a malfunction of the memory cell. As described previously, the word line voltage can be adjusted by controlling the operating voltage generator 210 through the control unit 220 according to the number of times of erasing stored in the flag cell.

As the second method, a value of the reference current (Itrip1 or Itrip2 in FIG. 2) used for sensing a turning on/off state of the memory cell can be changed according to the number of operation cycle stored in the flag cell. To explain concretely, an extent of the turning-on of the switching element N201 connected between the bit line BLm and the sensing node SO1 of the page buffer MPB can be controlled so at to change a value of the reference current according to the number of times of erasing. That is, if an extent of the turning-on of the switching element N201 is adjusted to reduce the amount of the current Itrip flowing in the bit line BLm, a value of the reference current can be lowered.

For example, the number of times of erasing stored in the flag cell is read before the voltage (in particular, the voltage to be applied to the word line) necessary for performing the reading operation is applied. And, in a case where the number of times of erasing is "1" this may mean that the accumulated number of operation cycle corresponds to the initial value so that an extent of the turning-on of the switching element N201 is controlled. Accordingly, the amount of current Itrip flowing in the bit line BLm is adjusted to set a value of the reference current used for sensing the turn on/off of the memory cell to the first current Itrip1. In a case where the number of times of erasing is "2", this may mean that the accumulated number of operation cycle corresponds to 1000 so that an extent of the turning-on of the switching element N201 is controlled. Accordingly, the amount of current Itrip flowing in the bit line BLm is adjusted again to set a value of the reference current used for sensing the turn on/off of the memory cell to the second current Itrip2 smaller than the first current Itrip1. In a case where the number of times of erasing is "3", a value of the reference current can be set as a third current Itrip3 smaller than the second current Itrip2 through the same method.

A relation between the number of times of erasing and the number of operation cycle and an amount of current flowing in the bit line described above are exemplarily provided for illustrating the operation and can be changed.

After the voltage (i.e., the word line voltage) or the reference current necessary for sensing the turn-on state or the turn-off state of the memory cell is adjusted as described above, the reading operation is performed (step 440 in FIG. 4).

In the method described above, the accumulated number of operation cycle is grasped by means of the number of times of erasing of the memory cell in the erasing operation performed in the ISPE manner, and as the accumulated number of operation cycle is increased, the word line voltage necessary for the reading operation is increased or the reference current is lowered, and thus, even if the threshold voltage of the memory cell is changed, it is possible to prevent a malfunction of the memory cell.

On the other hand, the program-verifying operation performed after the programming operation of the flash memory cell can be performed in a way similar to the reading operation.

Although the program characteristic or the erase characteristic of the memory cell is changed due to increased number of operation cycle, the present invention can adjust the operating voltage (or current) applied during the reading operation to enhance an accuracy of the reading operation, thereby preventing a malfunction of the memory cell.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory device, comprising:
   a main cell array including strings, each string being connected to one of a plurality of first bit lines;
   a flag cell array including strings, each string being connected to one of a plurality of second bit lines;
   page buffers, each of which being connected to the first and second bit lines;
   an operating voltage generator for supplying voltages necessary for programming/erasing/reading operations to the main cell array and the flag cell array; and
   a bit line current control unit configured to adjust an amount of current flowed in the first bit line so as to change a value of reference current used for sensing turn-on/turn-off states of a memory cell included in the main cell array.

2. The flash memory device of claim 1, wherein the number of times of erasing in an erasing operation performed in an ISPE (Increasement Step Pulse Erase) manner is stored in some of flag cells included in the flag cell array.

3. The flash memory device of claim 2, wherein the bit line current control unit adjusts the amount of current flowed in the first bit line according to the number of times of erasing stored in the flag cells.

4. The flash memory device of claim 2, wherein the bit line current control unit controls an extent of turning on of a switching element connected between a sensing node in the page buffer and the first bit line according to the number of times of erasing to adjust the amount of current flowing in the first bit line.

5. The flash memory device of claim 4, wherein the bit line current control unit controls an extent of turning on of the switching element to lower a value of the reference current as the number of times of erasing is increased.

6. A flash memory device, comprising:
   a main cell array including strings, each string being connected to a plurality of word lines and one of a plurality of first bit lines;
   a flag cell array including strings, each string being connected to a plurality of word lines and one of a plurality of second bit lines;
   page buffers, each of which being connected to the first and second bit lines; and
   an operating voltage generator for supplying voltages applied to the word lines,
   wherein the operation voltage generator adjust the level of voltage applied to a selected word line during a reading operation or a program-verifying operation, according to the number of times of erasing.

7. The flash memory device of claim 6, wherein the voltage is adjusted proportional to the number of the times of erasing.

8. The flash memory device of claim 6, wherein the number of times of erasing in an erasing operation is stored in some of flag cells included in the flag cell array.

9. A method of operating a flash memory device, comprising the steps of:
   applying an erase voltage to a memory cell included in a memory cell block to perform an erasing operation of the memory cell;
   comparing a threshold voltage of the memory cell with a target voltage;
   increasing a level of the erase voltage to perform again the erasing operation of the memory cell block if the threshold voltage is higher than the target voltage; and
   storing the number of times of the erasing operation if the threshold voltage is smaller than the target voltage.

10. The method of operating a flash memory device of claim 9, wherein the flash memory device comprises a main cell array and a flag cell array and the number of times of an erasing operation is stored in a flag cell included in the flag cell array.

11. The method of operating a flash memory device of claim 9, further comprising the step of increasing the number of times of an erasing operation after performing the erasing operation.

12. A method of operating a flash memory device, comprising the steps of:
performing an erasing operation of a memory cell block including a main cell array and a flag cell array;
comparing a threshold voltage of the memory cell included in the main cell array with a target voltage;
increasing a level of the erase voltage to perform again the erasing operation of the memory cell block if the threshold voltage is higher than the target voltage; and
storing the number of times of the erasing operation in the flag cell included in the flag cell array if the threshold voltage is smaller than the target voltage.

13. The method of operating a flash memory device of claim 12, further comprising the step of increasing the number of times of an erasing operation after performing the erasing operation.

14. A method of operating a flash memory device, comprising the steps of:
performing an erasing operation of a memory cell block in an ISPE (Increasement Step Pulse Erase) manner;
storing the number of times of erasing of the memory cell block during the erasing operation;
adjusting a level of voltage to be applied to a selected word line during a reading operation or a program-verifying operation, according to the number of times of erasing; and
applying the adjusted voltage to the selected word line to perform the reading operation or the program-verifying operation.

15. The method of operating a flash memory device of claim 14, wherein the voltage is adjusted proportional to the number of the times of erasing.

16. The method of operating a flash memory device of claim 14, wherein the memory cell block comprises a main cell array and a flag cell array.

17. The method of operating a flash memory device of claim 14, further comprising the step of increasing the number of times of erasing after performing the erasing operation.

18. A method of operating a flash memory device, comprising the steps of:
performing an erasing operation of a memory cell block including memory cell in an ISPE (Increasement Step Pulse Erase) manner;
storing the number of times of erasing of the memory cell block during the erasing operation;
setting a value of a reference current necessary for sensing a turning on/turning off of the memory cell during a reading operation or a program-verifying operation, according to the number of times of erasing; and
applying a voltage to a word line of the memory cell and comparing the amount of current flowing in the memory cell and a value of the reference current to perform the reading operation or the program-verifying operation.

19. The method of operating a flash memory device of claim 18, wherein the reference current is lowered as the number of the times of an erasing is increased.

20. The method of operating a flash memory device of claim 19, wherein the reference current is set by adjusting an amount of current flowing in a bit line.

21. The method of operating a flash memory device of claim 20, wherein the amount of current flowing in the bit line is changed according to an extent of the turning-on of a switching element connected between a sensing node of a page buffer and the bit line.

22. The method of operating a flash memory device of claim 18, wherein the memory cell block comprises a main cell array and a flag cell array.

23. The method of operating a flash memory device of claim 22, wherein the number of times of erasing is stored in a flag cell included in the flag cell array.

24. The method of operating a flash memory device of claim 18, further comprising the step of increasing the number of times of erasing after performing the erasing operation.

* * * * *